United States Patent
Kim (10) Patent No.: US 8,927,126 B2
(45) Date of Patent: Jan. 6, 2015

(54) PROTECTION CIRCUIT ASSEMBLY AND BATTERY PACK HAVING THE SAME

(75) Inventor: Bong-Young Kim, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 1340 days.

(21) Appl. No.: 12/406,005

(22) Filed: Mar. 17, 2009

(65) Prior Publication Data

US 2009/0258283 A1    Oct. 15, 2009

(30) Foreign Application Priority Data

Apr. 11, 2008   (KR) .................. 10-2008-0033820

(51) Int. Cl.
| | |
|---|---|
| *H01M 10/50* | (2006.01) |
| *H01M 2/04* | (2006.01) |
| *H01M 10/42* | (2006.01) |
| *H05K 3/34* | (2006.01) |
| *H01M 10/052* | (2010.01) |

(52) U.S. Cl.
CPC .......... *H01M 2/0404* (2013.01); *H01M 10/425* (2013.01); *H05K 3/3405* (2013.01); *H01M 10/052* (2013.01); *H01M 2200/00* (2013.01); *H05K 3/3421* (2013.01); *H05K 2201/09181* (2013.01); *H05K 2201/1034* (2013.01)
USPC ........................................................ 429/62

(58) Field of Classification Search
None
See application file for complete search history.

(56) References Cited

U.S. PATENT DOCUMENTS

2006/0127756 A1*  6/2006  Seo .............................. 429/175
2007/0188132 A1*  8/2007  Kim et al. .................... 320/112

FOREIGN PATENT DOCUMENTS

| JP | 2002-208389 | 7/2002 |
| JP | 2006-059553 | 3/2006 |
| KR | 10-2005-0055580 | 6/2005 |
| KR | 10-2005-0081175 | 8/2005 |
| KR | 10-2005-0103521 | 10/2005 |
| KR | 10-2006-0027267 | 3/2006 |
| KR | 10-0770102 | 10/2007 |

OTHER PUBLICATIONS

KIPO Office action dated Dec. 3, 2009, for priority Korean application 10-2008-0033820, noting listed reference in this IDS.
Notice of Allowability dated May 10, 2010 issued in the priority Korean patent application No. KR 10-2008-0033820, listing the cited reference in this IDS. Cited reference KR 10-2005-0081175 was previously listed in an IDS filed Feb. 22, 2010.

* cited by examiner

*Primary Examiner* — Barbara Gilliam
*Assistant Examiner* — Adam A Arciero
(74) *Attorney, Agent, or Firm* — Christie, Parker & Hale, LLP (57) ABSTRACT

A battery pack includes a bare cell and a protection circuit assembly electrically connected to the bare cell. The protection circuit assembly includes a protection circuit board on which a protection module, a PTC thermistor, an external connection terminal, a first connection terminal and a second connection terminal are mounted. A first lead plate and a second lead plate are in contact with the first connection terminal and the second connection terminal, respectively. The protection circuit board defines opposite lateral edges and a first groove in each of the opposite lateral edges, and the first lead plate is exposed through the first groove.

22 Claims, 11 Drawing Sheets

PROTECTION CIRCUIT ASSEMBLY AND BATTERY PACK HAVING THE SAME

CROSS-REFERENCE TO RELATED APPLICATION

This application claims priority to and the benefit of Korean Patent Application No. 10-2008-0033820, filed Apr. 11, 2008, the entire content of which is incorporated herein by reference.

BACKGROUND OF THE INVENTION

1. Field of the Invention

The present invention relates to a protection circuit assembly and a battery pack having the same.

2. Description of the Related Art

Secondary batteries are rechargeable and can be repeatedly used. Thus, secondary batteries may be more economical than disposable batteries.

Also, secondary batteries can have a high capacity with a small volume, allowing secondary batteries to be used in high power products such as hybrid cars and electric tools as well as handheld electrical appliances.

Secondary batteries include, for example, nickel-cadmium batteries, nickel-metal hydride batteries, nickel-zinc batteries and lithium secondary batteries.

Lithium secondary batteries are widely used because they are compact and have high capacity, a high operating voltage and a high energy density per unit weight.

Lithium secondary batteries may be formed by accommodating an electrode assembly and an electrolyte in a case, and sealing the case.

The electrode assembly may be formed in a jelly-roll shape by stacking and winding a positive electrode plate, a negative electrode plate and a separator.

Lithium secondary batteries may be classified into a can type and a pouch type depending on the shape of the case, and the can-type batteries may be classified into a rectangular type and a cylindrical type.

A lithium secondary battery may be electrically connected to a protection circuit board to prevent hazards caused by abnormal operation such as overcharge, overdischarge and overcurrent.

The protection circuit board may include protection devices such as a PTC thermistor, a protection circuit, a fuse and a temperature sensor.

The secondary battery and the protection circuit board may be used in the shape of a battery pack, which may be a hard pack type in which the secondary battery and the protection circuit board are accommodated in a separate case.

Further, the battery pack may be an inner pack type in which the protection circuit board is covered with a cover to be protected and an exterior is tubed and labeled.

In that case, the protection circuit board may include a lead plate to be electrically connected with the secondary battery.

Since the protection circuit board may include a connection terminal in contact with a lead plate, a space for mounting the protection devices is reduced.

In addition, a part of the lead plate may be exposed to facilitate welding, such that the lead plate can be attached to the secondary battery by laser welding.

Conventionally, the protection circuit board may be relatively small and it may be difficult to partially expose the lead plates in contact with both ends of the protection circuit board.

Thus, a space for mounting protection devices becomes smaller as the protection circuit board becomes smaller, making exposure of the lead plates more difficult.

SUMMARY OF THE INVENTION

Aspects of the present invention provide a protection circuit assembly including a component mounting space and enhanced weld strength, and a battery pack having the same.

According to an embodiment of the present invention, a battery pack includes a bare cell and a protection circuit assembly electrically connected to the bare cell. The protection circuit assembly includes a protection circuit board on which a protection module, a PTC thermistor, an external connection terminal, a first connection terminal and a second connection terminal are mounted. A first lead plate and a second lead plate are in contact with the first connection terminal and the second connection terminal, respectively. The protection circuit board defines opposite lateral edges and a first groove in each of the opposite lateral edges, and the first lead plate is exposed through the first groove.

The bare cell may include an electrode assembly, a can housing the electrode assembly, and a cap assembly sealing the can, the cap assembly including a cap plate and an electrode terminal, the first lead plate being in contact with the cap plate, and the second lead plate being in contact with the electrode terminal. Further, the protection circuit board may include a first region on which the protection module, the PTC thermistor, the external connection terminal and the second connection terminal are mounted, and a second region on which the first connection terminal is mounted, and in which the first groove is defined.

In another embodiment, a thickness of the second region is less than a thickness of the first region. Additionally, the first lead plate may define a flat top surface in contact with the first connection terminal, a support surface extending from an edge of the flat top surface, and a bottom surface in contact with the cap plate and extending from an edge of the support surface in the same direction as the flat top surface, wherein the bottom surface is exposed through the first groove. The first connection terminal may define a flat panel or a flat panel having a second groove corresponding to the first groove. The flat top surface and the bottom surface may extend from a center of the protection circuit board toward a proximate lateral edge or they may extend toward a center of the protection circuit board from a proximate lateral edge.

In other embodiments, a length of the flat top surface may be less than a length of the bottom surface, or a length of the flat top surface may be substantially identical to a length of the bottom surface, and the flat top surface may include a third groove corresponding to the first groove. Further, the flat top surface may define a hole corresponding to the first groove, and the hole may also be defined by the flat top surface and the support surface.

Additional aspects and/or advantages of the invention will be set forth in the description that follows.

DETAILED DESCRIPTION OF THE INVENTION

Reference will now be made in detail to the present embodiments of the present invention, examples of which are illustrated in the accompanying drawings, wherein like reference numerals refer to like elements throughout. The embodiments are described below in order to explain the present invention with reference to the figures.

Figure 1:
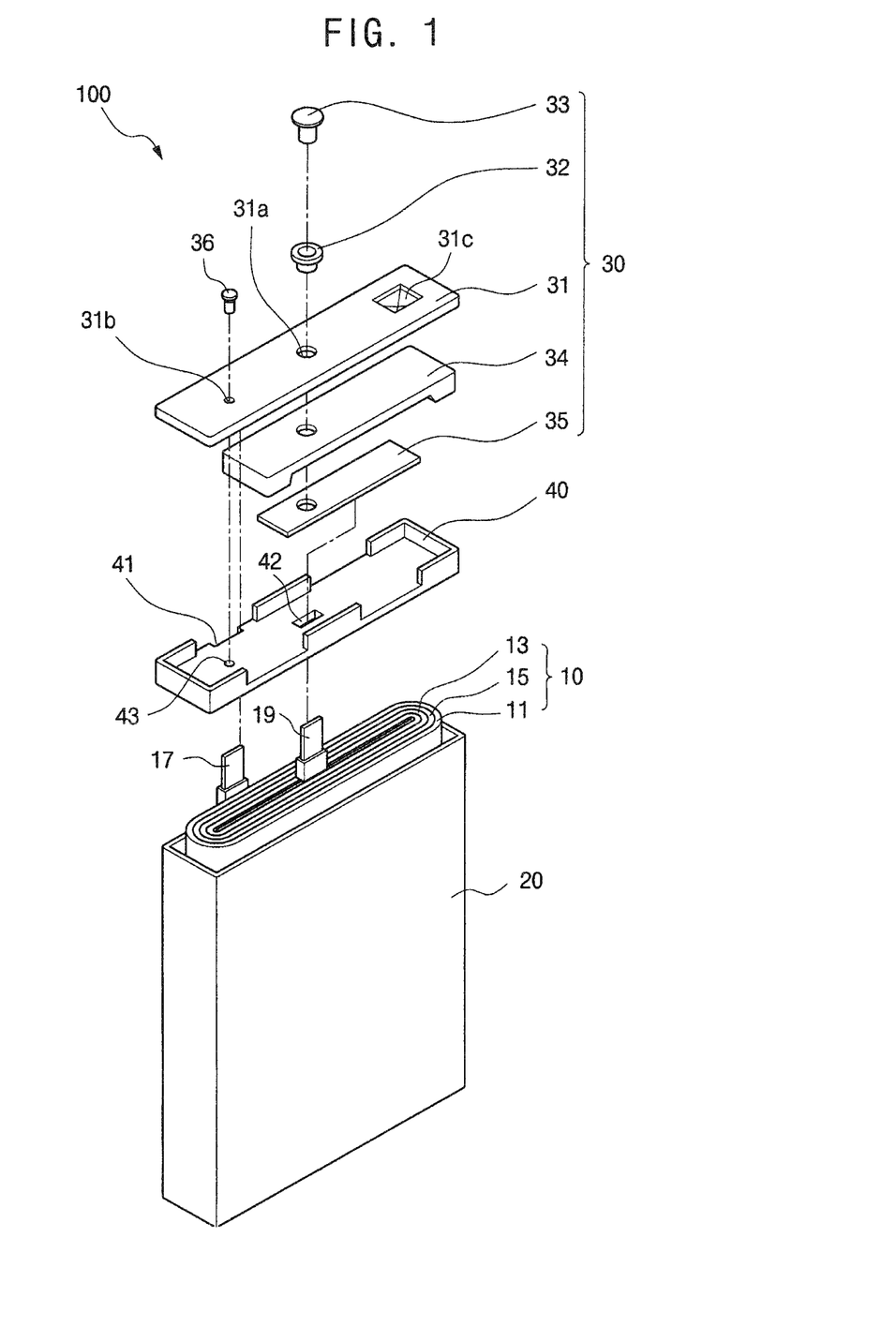
FIG. 1 is an exploded perspective view of a battery pack according to an embodiment of the present invention.

FIG. 1 is an exploded perspective view of a bare cell according to an embodiment of the present invention. Referring to FIG. 1, a bare cell 100 includes an electrode assembly 10, a can 20 accommodating the electrode assembly 10, and a cap assembly 30 coupled to one side of the can 20.

The bare cell 100 also includes an insulating case 40 disposed at an upper portion of the electrode assembly 10 accommodated in the can 20.

The electrode assembly 10 may be formed in a jelly-roll shape by stacking and winding a first electrode plate 11, a second electrode plate 13 and a separator 15.

Hereinafter, the first electrode plate 11 is called a positive electrode plate, and the second electrode plate 13 is called a negative electrode plate.

Polarities of the first and second electrode plates 11, 13 may be changed or reversed depending on a process for forming the electrode plates.

The positive electrode plate 11 is formed by applying a positive electrode active material to a positive electrode collector formed of aluminum, and includes a positive electrode uncoated portion absent the positive electrode active material.

The negative electrode plate 13 is formed by applying a negative electrode active material to a negative electrode collector formed of copper, and includes a negative electrode uncoated portion absent a negative electrode active material.

The separator 15 is interposed between the positive and negative electrode plates 11, 13 to insulate both electrode plates 11, 13 from each other.

The separator 15 may be formed of thermoplastic resin such as polyethylene (PE) or polypropylene (PP), and have a porous surface serving as a passage for moving lithium ions.

The first electrode tab 17 is attached to be in electrical communication with the positive electrode uncoated portion, and the second electrode tab 19 is attached to be in electrical communication with the negative electrode uncoated portion.

Thus, the first electrode tab 17 has the same polarity as the first electrode plate 11, and the second electrode tab 19 has the same polarity as the second electrode plate 13.

Hereinafter, the first electrode tab 17 is called a positive electrode tab, and the second electrode tab 19 is called a negative electrode tab.

Here, the positive and negative electrode tabs 17, 19 may be formed of nickel, and may be attached to the positive and negative electrode uncoated portions by ultrasonic welding or laser welding.

However, the present invention is not limited to the materials and bonding methods for the positive and negative electrode tabs 17, 19.

The can 20 may have an opening at one side, and accommodate the electrode assembly 10, the insulating case 40 and the electrolyte.

The can 20 may be formed of a metallic material such as aluminum, stainless steel, etc and may serve as an electrode terminal.

The can 20 may be formed in a rectangular shape or an oval shape having rounded corners, and the opening of the can 20 is sealed by the cap assembly 30.

The cap assembly 30 may include a cap plate 31, an insulating gasket 32, an electrode terminal 33, an insulating plate 34, a terminal plate 35 and an electrolyte inlet plug 36.

The cap plate 31 is connected with the opening of the can 20 to seal the opening of the can 20.

The positive electrode tab 17 is attached to a bottom surface of the cap plate 31.

The cap plate 31 includes a terminal through-hole 31$a$ formed to insert the insulating gasket 32 and the electrode terminal 33 therethrough.

The cap plate 31 also includes an electrolyte inlet 31$b$ formed to provide a passage for injecting the electrolyte into the can 20.

The cap plate 31 also includes a vent 31$c$ which is fractured in response to an increased inner pressure of the battery to exhaust a gas, and a notch is formed in the vent to facilitate the fracture of the vent.

The insulating gasket 32 is connected with the terminal through-hole 31$a$, and a hole is formed in a center of the insulating gasket 32 to be connected with the electrode terminal 33.

The electrode terminal 33 is inserted into the hole formed in the insulating gasket 32, and a lower portion of the electrode terminal 33 is electrically connected with the terminal plate 35.

The insulating plate 34 is disposed under the cap plate 31, and insulates the cap plate 31 from the terminal plate 35.

The terminal plate 35 is disposed under the insulating plate 34, and formed of a conductive material.

The negative electrode tab 19 is attached to a bottom surface of the terminal plate 35.

Accordingly, the cap plate 31 has a positive polarity, and the electrode terminal 33 has a negative polarity.

The insulating case 40 is disposed on the electrode assembly 10 inserted into the can 20, and prevents movement of the electrode assembly 10.

The insulating case 40 may have a tab groove 41 and a tab hole 42 to separate the positive electrode tab 17 from the negative electrode tab 19 by a distance to prevent a short circuit, and to serve as a guide for projecting the tabs therethrough.

The insulating case 40 may also have an inlet hole 43 for providing a passage through which the electrolyte injected into the insulating case 40 can easily flow to the electrode assembly 10.

Referring to FIGS. 2A to 3B, a battery pack includes a bare cell 100 and a protection circuit assembly 200 disposed at one side of the bare cell 100.

The bare cell 100 has the configuration as illustrated in FIG. 1, so that it can be easily understood with reference to FIG. 1 and the detailed descriptions thereof. Thus, detailed descriptions thereof will herein be omitted.

The protection circuit assembly 200 includes a protection circuit board 210, and several lead plates 230, 250, 270 for providing electrical contact between the bare cell 100 and the protection circuit board 210.

Figure 2A:
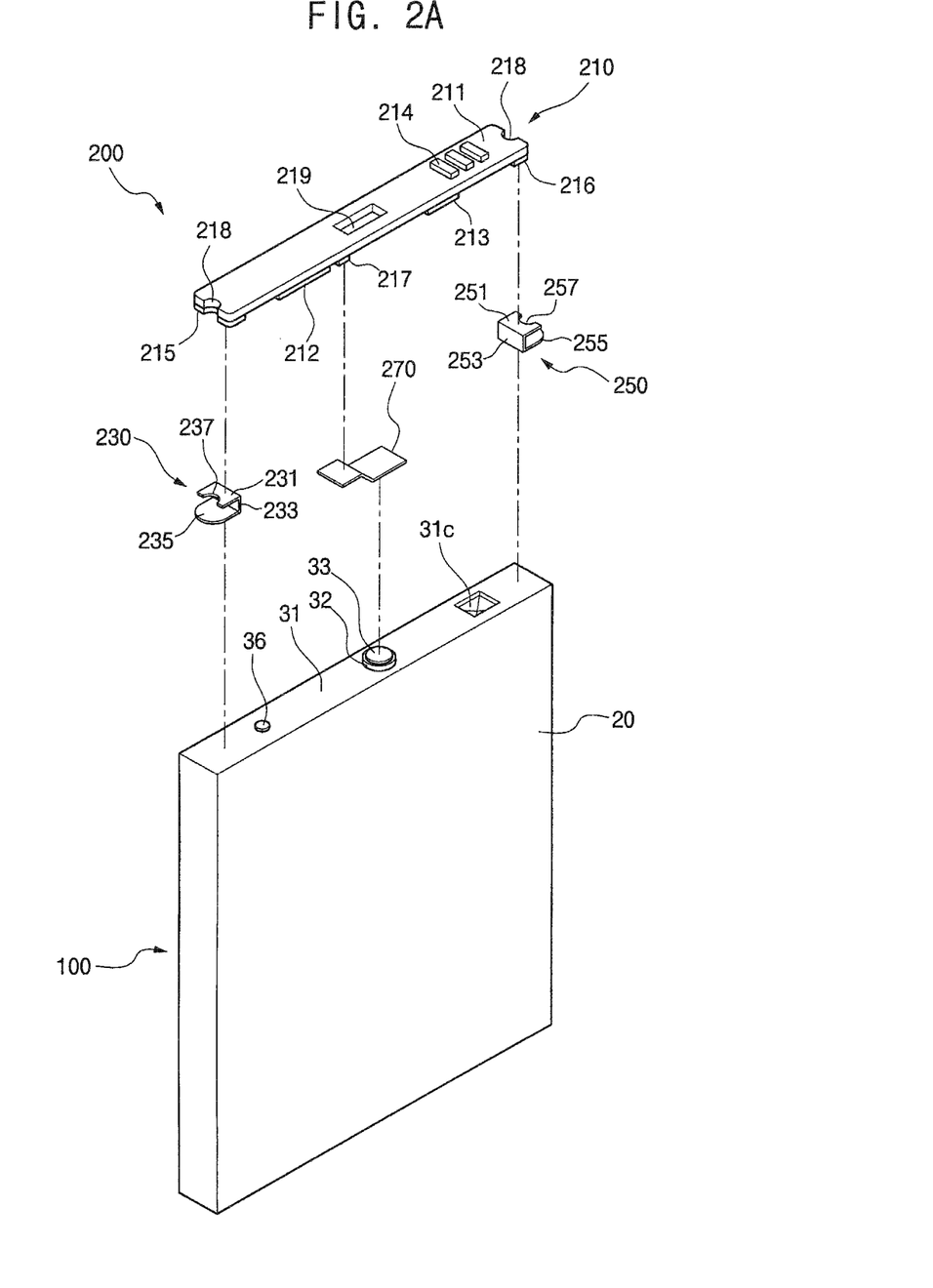
FIGS. 2A and 2B are an exploded and a partially-assembled perspective view, respectively, of a battery pack of FIG. 1.
Figure 2B:
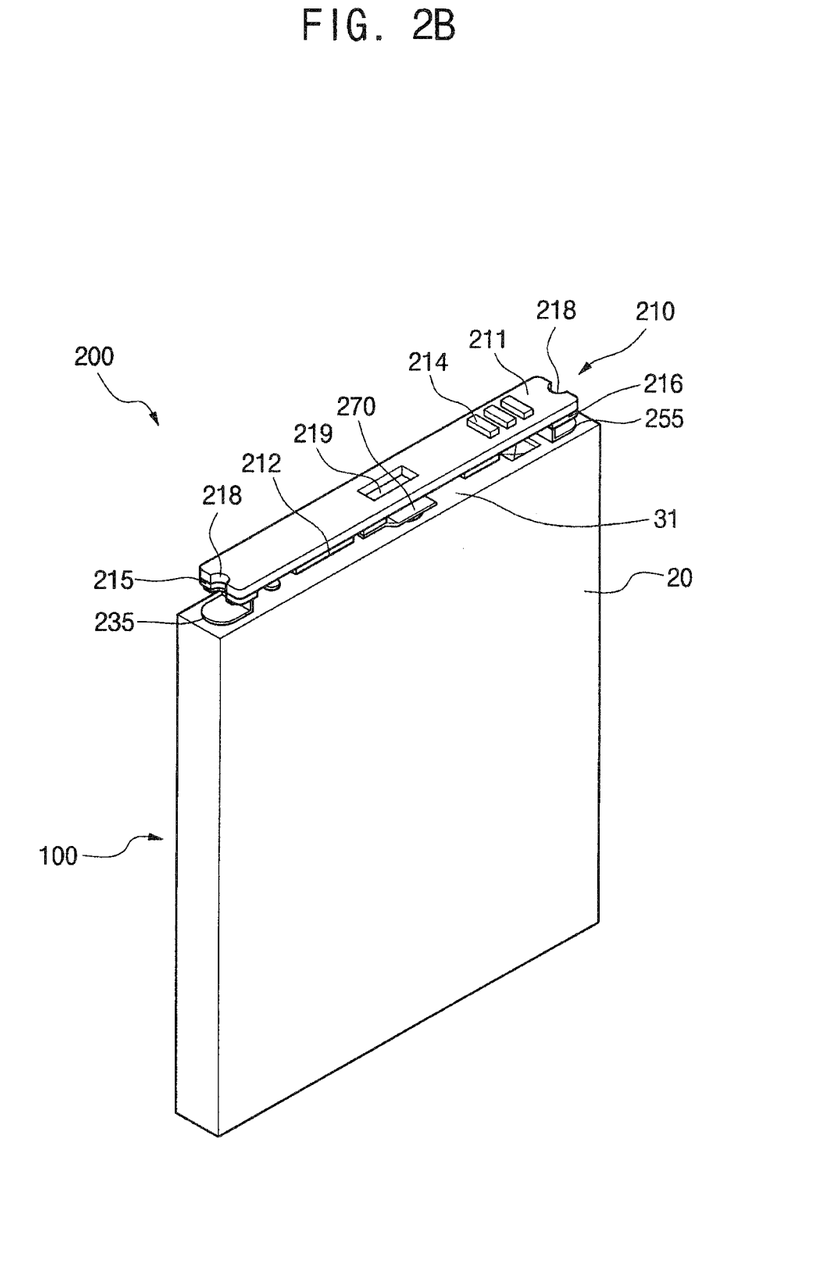
Figure 3A:
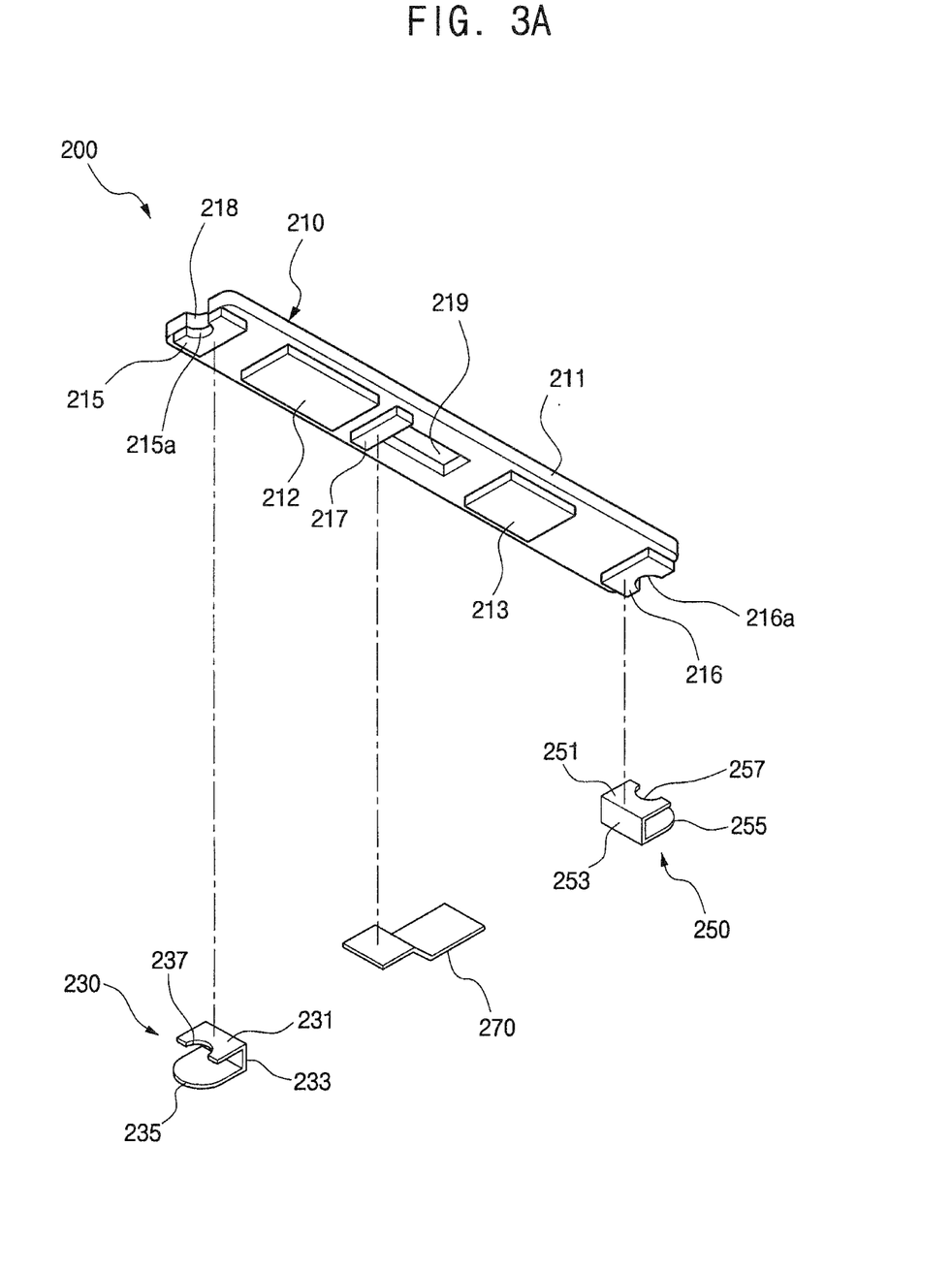
FIGS. 3A and 3B are an exploded perspective view and an assembled cross-sectional view, respectively, of a protection circuit assembly according to an embodiment of the present invention.

The protection circuit board 210 may be formed by mounting a protection module 212, a PTC thermistor 213, an external connection terminal 214, and connection terminals 215, 216, 217 to be in contact with the lead plates 230, 250, 270, respectively, on a printed circuit board 211.

The lead plates 230, 250, 270 include first lead plates 230, 250 and a second lead plate 270.

Similarly, the connection terminals 215, 216, 217 include first connection terminals 215, 216 and a second connection terminal 217.

The protection module 212, the PTC thermistor 213 and the connection terminals 215, 216, 217 may be mounted under the protection circuit board 210 facing the bare cell 100, and the external connection terminal 214 may be mounted on the protection circuit board 210 facing an exterior of the battery pack.

The protection circuit board 210 may include a first region having the protection module 212, the PTC thermistor 213, the external connection terminal 214 and the second connection terminal 217, and second regions having the first connection terminals 215, 216.

Figure 3B:
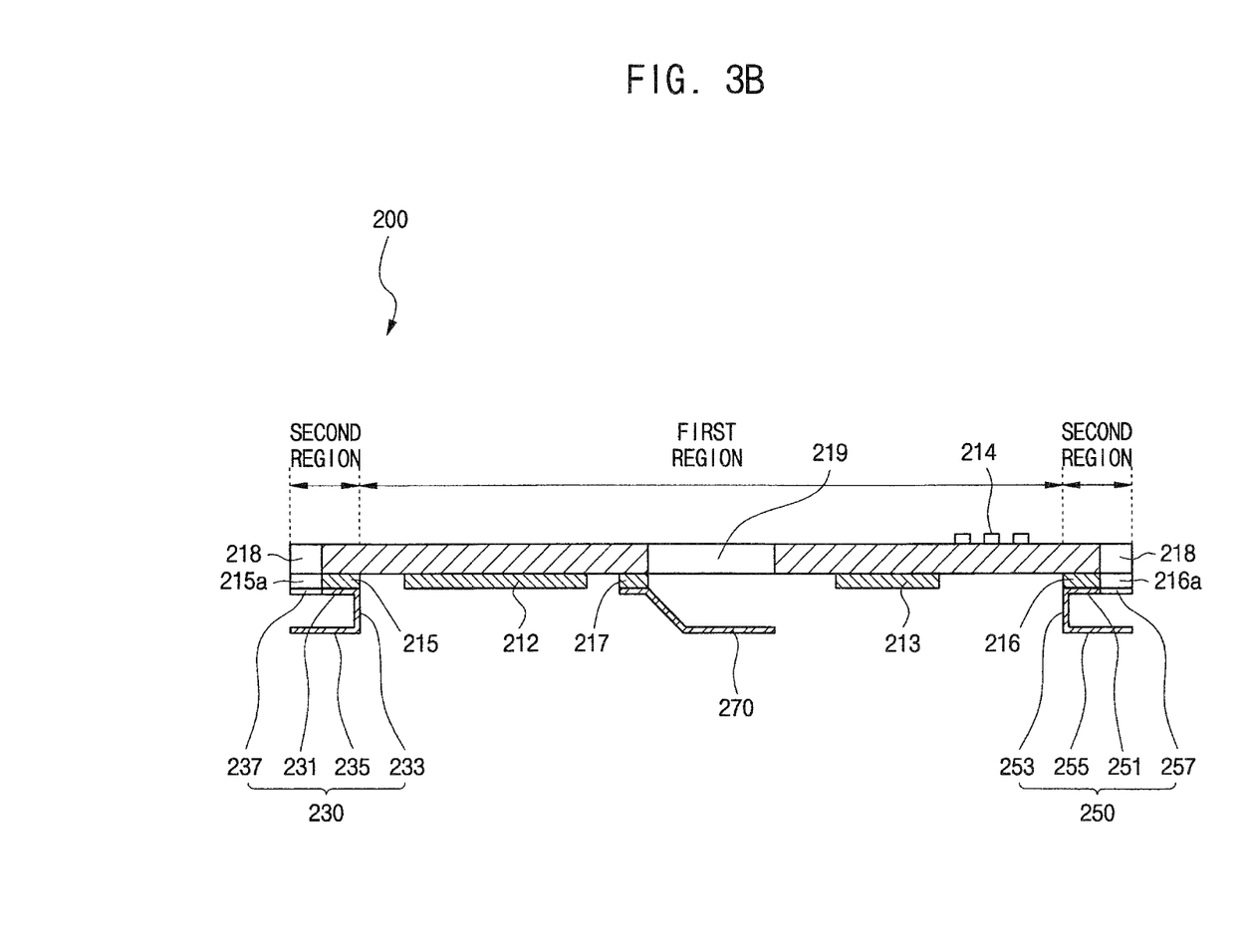

Since the second regions are regions on which the first connection terminals 215, 216 in contact with the first lead plate are mounted, when the second regions are thinner than the first region, an overall thickness of the protection circuit board may be reduced.

The first region is formed generally toward the center of the protection circuit board 210, and the second regions are formed at both edges or lateral ends of the protection circuit board 210. Thus, the first region is disposed between the second regions.

The protection circuit board 210 includes first grooves 218, which are formed in both lateral ends thereof, i.e., in the second regions of the protection circuit board 210.

The protection circuit board 210 also includes a terminal hole 219 formed in a location corresponding to or aligned with the electrode terminal 33 included in the bare cell 100.

The first connection terminals 215, 216 may be formed not to cover the first grooves 218, i.e., an edge of the first connection terminals 215, 216 may be recessed from or generally aligned with an edge of the first grooves.

More specifically, the first connection terminals 215, 216 may be formed of a flat panel or a flat panel having second grooves 215a, 216a (FIG. 3A) corresponding to or aligned with the first groove 218.

The first lead plates 230, 250 are in contact with the first connection terminals 215, 216, respectively, at one side or end, and in contact with the cap plate 31 at the other side or end; thereby each first lead plate 230, 250 is between a first connection terminal 215, 216 and the cap plate 31.

The second lead plate 270 is in contact with the second connection terminal 217 at one side, and in contact with the electrode terminal 33 at the other side.

Figure 3C:
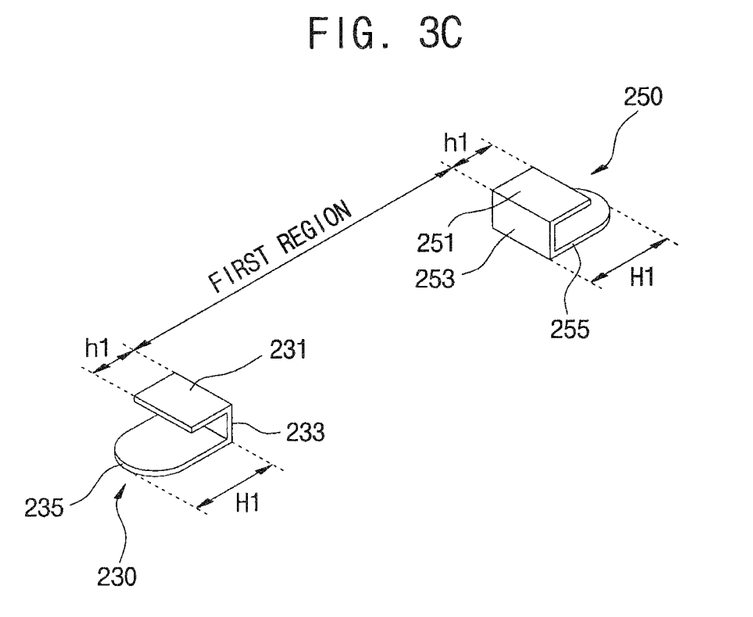
FIGS. 3C and 3D are perspective views of lead plates according to embodiments of the present invention.
Figure 3D:
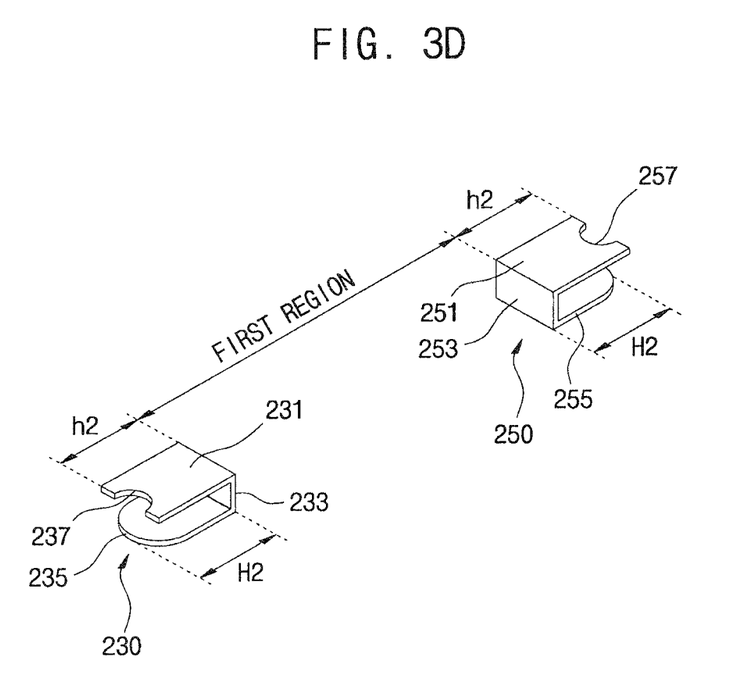

The first lead plates 230, 250 may include flat top surfaces 231, 251, support surfaces 233, 253 extending from an edge of the top surfaces 231, 251, and flat bottom surfaces 235, 255 extending in the same direction as the top surfaces 231, 251 from ends of the support surfaces 233, 253, to define a generally C-shaped or sideways U-shaped configuration.

The top surfaces 231, 251 are in contact with the first connection terminals 215, 216, and the bottom surfaces 235, 255 are in contact with the cap plate 31.

The top surfaces 231, 251 are formed not to cover the first grooves 218, so that the bottom surfaces 235, 255 may be exposed through the first grooves 218.

The top surfaces 231, 251 and the bottom surfaces 235, 255 may extend toward the lateral edges of the protection circuit board 210 from the support surfaces 233, 253.

As illustrated in FIG. 3C, in the first lead plates 230, 250 separated by the first region, lengths h1 of the top surfaces 231, 251 may be formed shorter than lengths H1 of the bottom surfaces 235, 255.

Further, as illustrated in FIG. 3D, in the first lead plates 230, 250, lengths h2 of the top surfaces 231, 251 may be about the same as lengths H2 of the bottom surfaces 235, 255, and third grooves 237, 257 may be formed in the top surfaces 231, 251 to correspond to or be aligned with the first grooves 218.

Since the bottom surfaces 235, 255 are exposed on the protection circuit board 210 when the first lead plates 230, 250 are attached to the cap plate 31, the bottom surfaces 235, 255 can be easily welded by laser welding, ultrasonic welding or resistance welding.

When a groove is formed in an edge of the protection circuit board as in the present invention, a component mounting space can be additionally provided while allowing the lead plates to be welded to the cap plate.

In addition, as the mounting space becomes wider, the number of layers of the protection circuit board having a multi layer structure can be decreased, and thus the thickness of the protection circuit board can also be decreased.

Figure 4A:
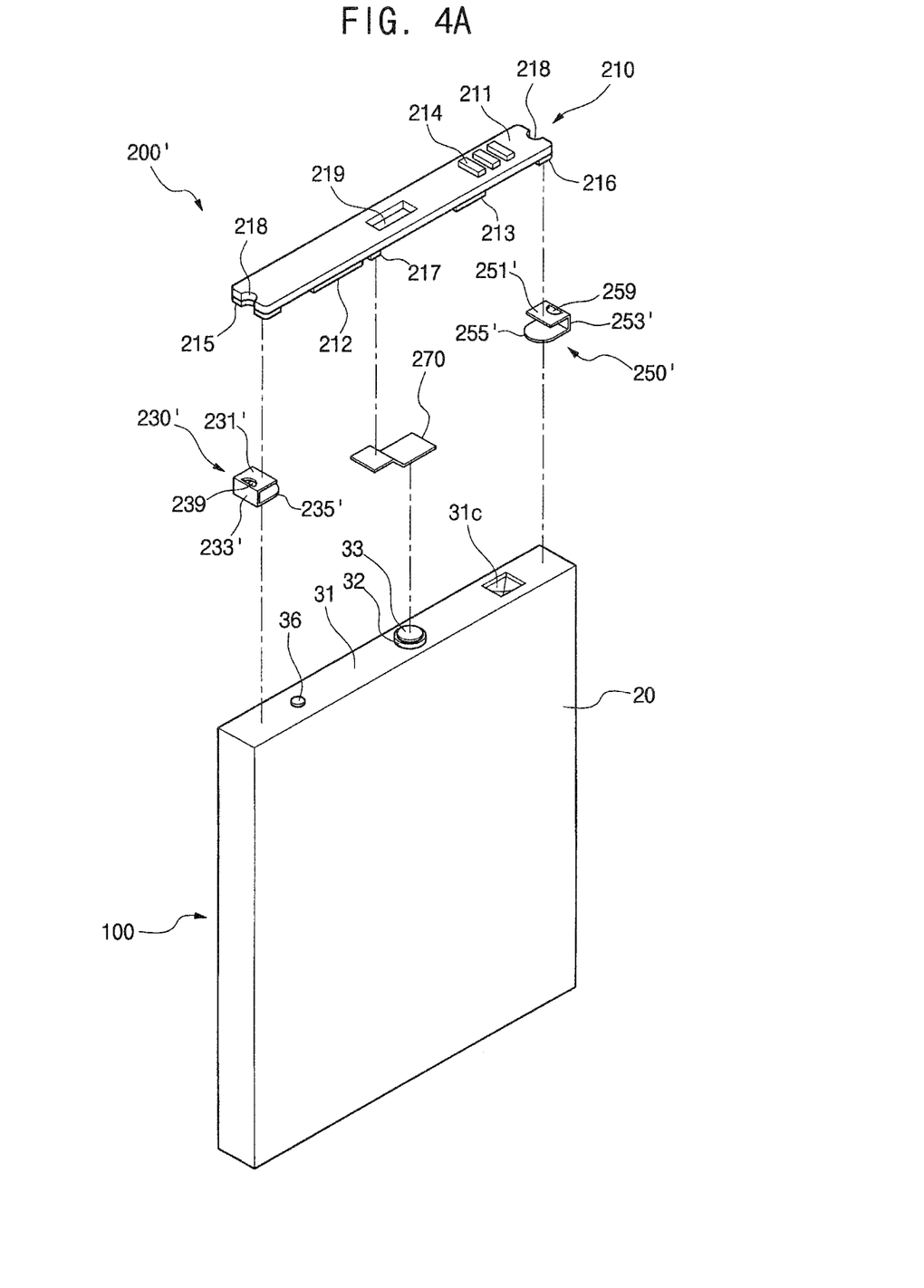
FIG. 4A is an exploded perspective view of a battery pack according to another embodiment of the present invention.
Figure 4B:
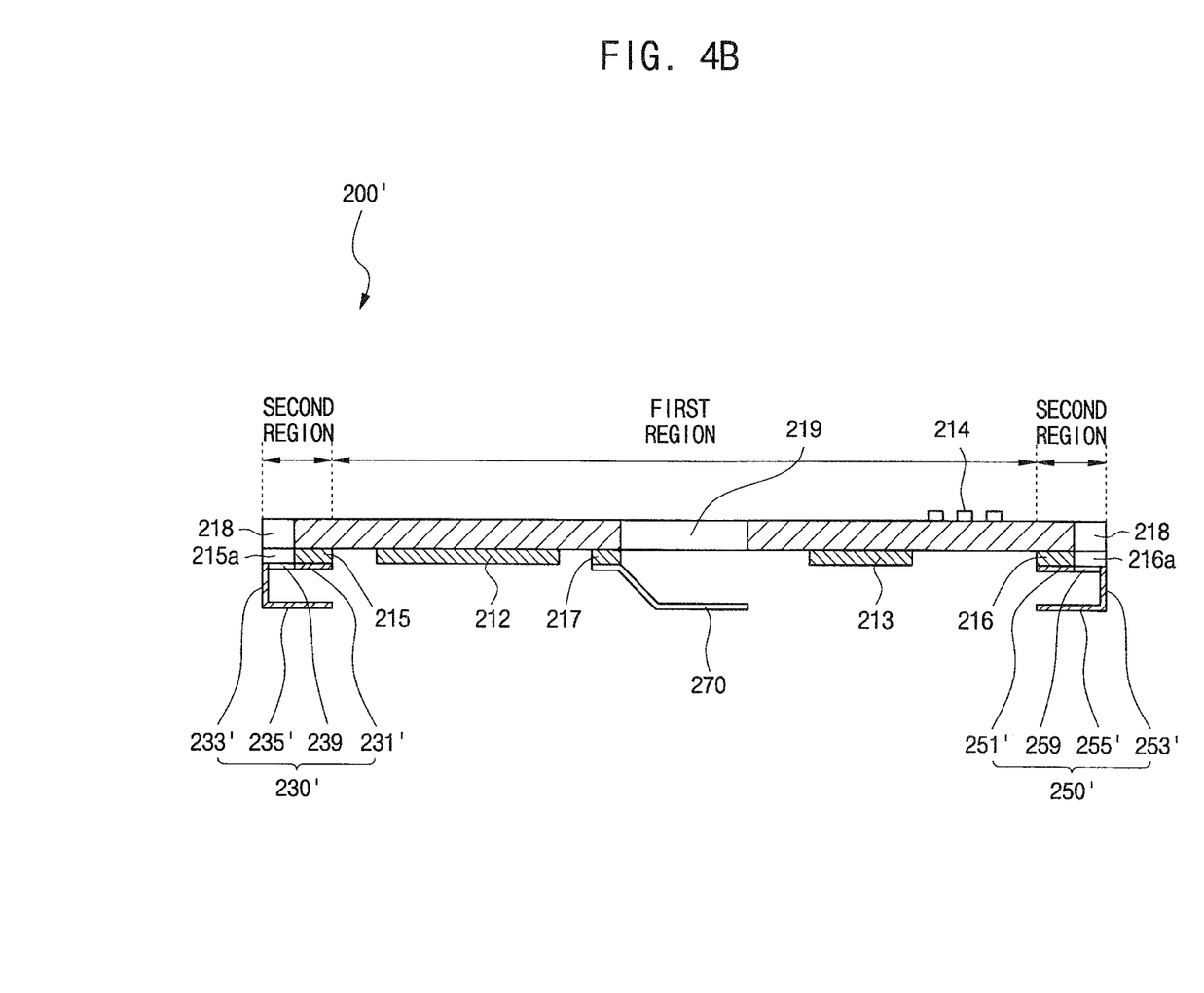
FIG. 4B is an assembled cross-sectional view of a protection circuit assembly of the battery back of FIG. 4A.

Referring to FIGS. 4A and 4B, a battery pack includes a bare cell 100 and a protection circuit assembly 200' disposed at one side of the bare cell 100.

The bare cell 100 has the same configuration as in FIG. 1, and thus detailed descriptions thereof will herein be omitted.

The protection circuit assembly 200' includes a protection circuit board 210 and several lead plates 230', 250', 270 for electrical contact between the bare cell 100 and the protection circuit board 210.

The lead plates 230', 250', 270 include first lead plates 230', 250' and a second lead plate 270.

The protection circuit board 210 and the second lead plate 270 have the same configurations and functions as those described above, and thus detailed descriptions thereof will herein be omitted.

The first lead plates 230', 250' are connected with the first connection terminals 215, 216 at one end, and are in contact with the cap plate 31 at the other end so as to be between the first connection terminals and the cap plate.

The first lead plates 230', 250' may include flat top surfaces 231', 251', support surfaces 233', 253' extending from an edge of the top surfaces 231', 251' and flat bottom surfaces 235', 255' extending in the same direction as the top surfaces 231', 251' from the support surfaces 233', 253'.

The top surfaces 231', 251' are in contact with the first connection terminals 215, 216, and the bottom surfaces 235', 255' are in contact with the cap plate 31.

The top and bottom surfaces 231', 251', 235', 255' extend toward a center of the protection circuit board 210 from lateral ends of each of the support surfaces 233', 253'.

In the present embodiment, the top surfaces 231', 251' do not cover the first grooves 218, allowing the bottom surfaces 235', 255' to be exposed through the first grooves 218.

More specifically, the first lead plates 230', 250' include holes 239, 259 formed to correspond to or be aligned with the first grooves 218 formed in the protection circuit board 210 to allow the bottom surface 235', 255' of each first lead plate 230', 250' to be exposed.

Figure 4C:
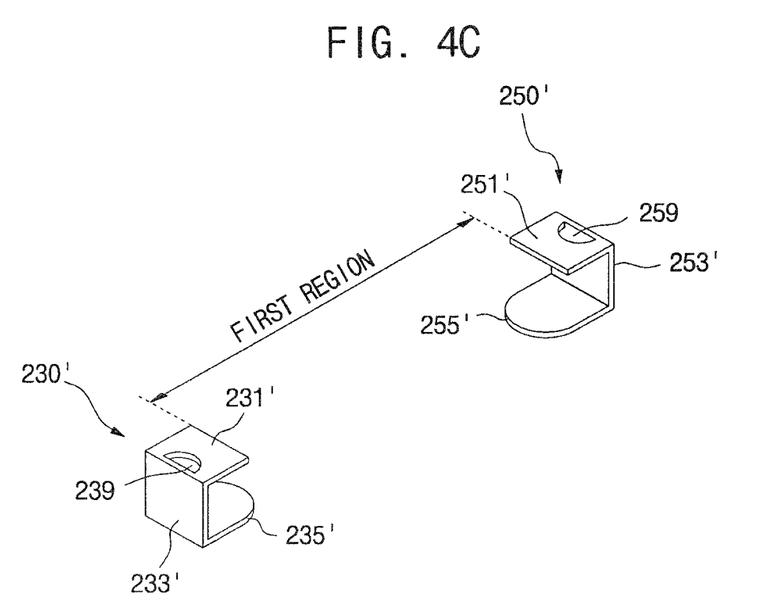
FIGS. 4C and 4D are perspective views of lead plates according other embodiments of the present invention.
Figure 4D:
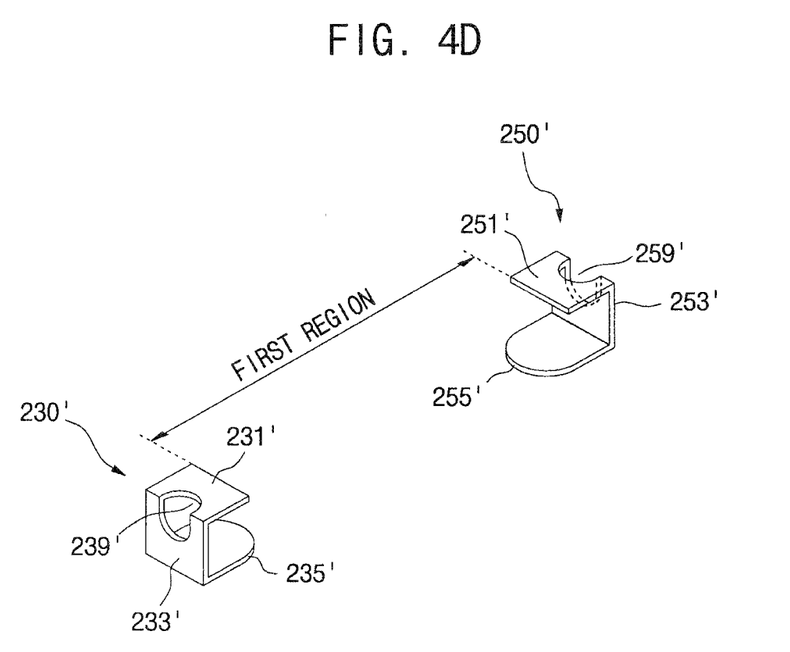

FIGS. 4C and 4D are perspective views illustrating various shapes of lead plates according to another embodiment of the present invention.

As illustrated in FIG. 4C, the holes 239, 259 may be formed in the top surfaces 231', 251' of each lead plate 230', 250'.

Alternatively, as illustrated in FIG. 4D, the holes 239', 259' may be formed in the top surfaces 231', 251' and the support surfaces 233', 253' of each lead plate 230', 250'.

Thus, the bottom surfaces 235', 255' are exposed on the protection circuit board 210 through the first grooves 218 and the holes 239, 259, or the first grooves 218, the second grooves 215a, 216a and the holes 239', 259'.

Since the bottom surfaces 235', 255' are exposed on the protection circuit board 210 when the first lead plates 230', 250' are attached to the cap plate 31, the bottom surfaces 235', 255' can be easily welded by laser welding, ultrasonic welding or resistance welding.

When a groove is formed in an edge of the protection circuit board as in the present invention, a component mounting space can be additionally provided while allowing the lead plates to be welded to the cap plate.

In addition, since the mounting space is larger, the number of layers of the protection circuit board having a multi layer structure can be decreased, and thus the thickness of the protection circuit board can also be decreased.

Figure 5A:
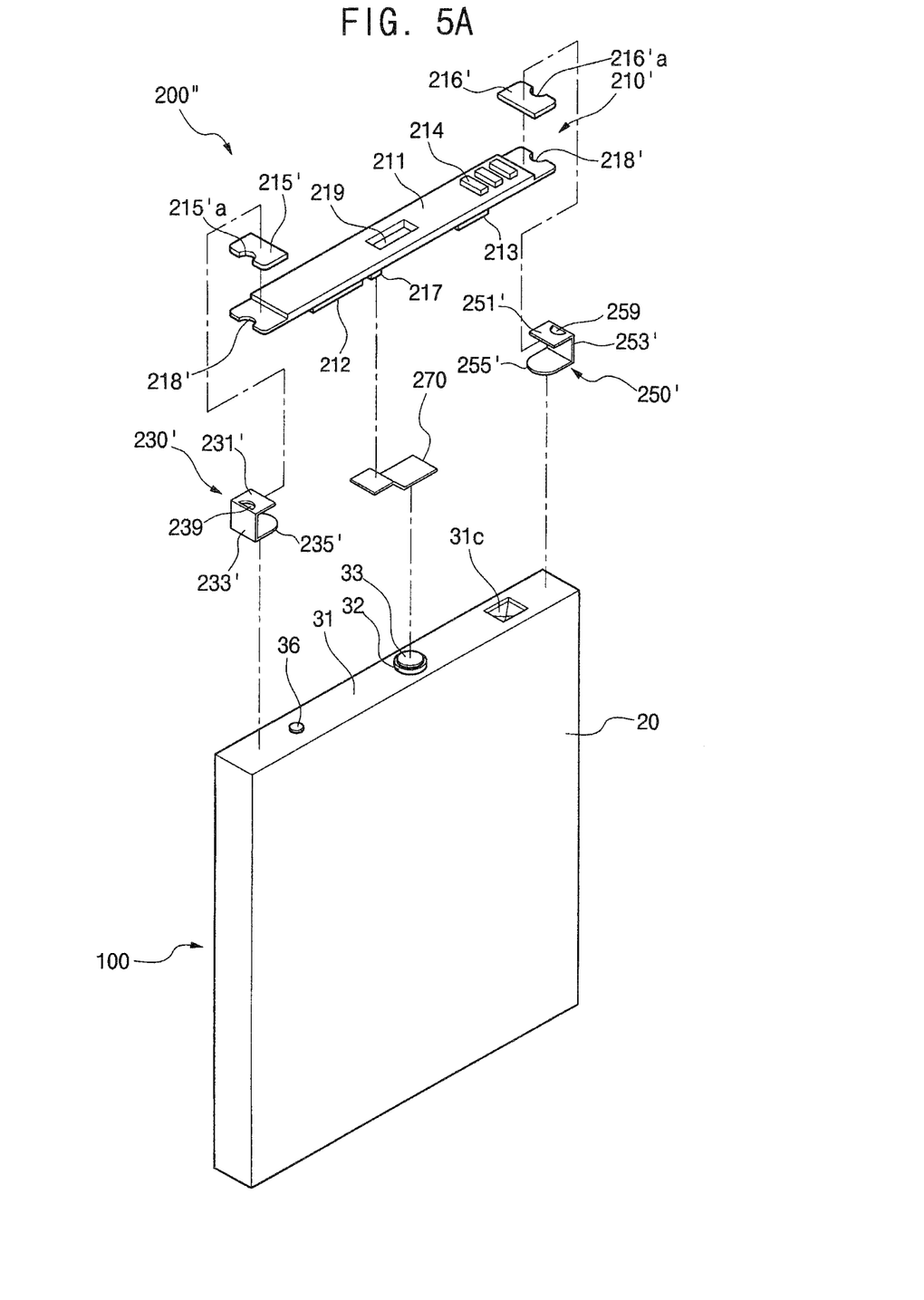
FIG. 5A is an exploded perspective view of a battery pack according to yet another embodiment of the present invention.
Figure 5B:
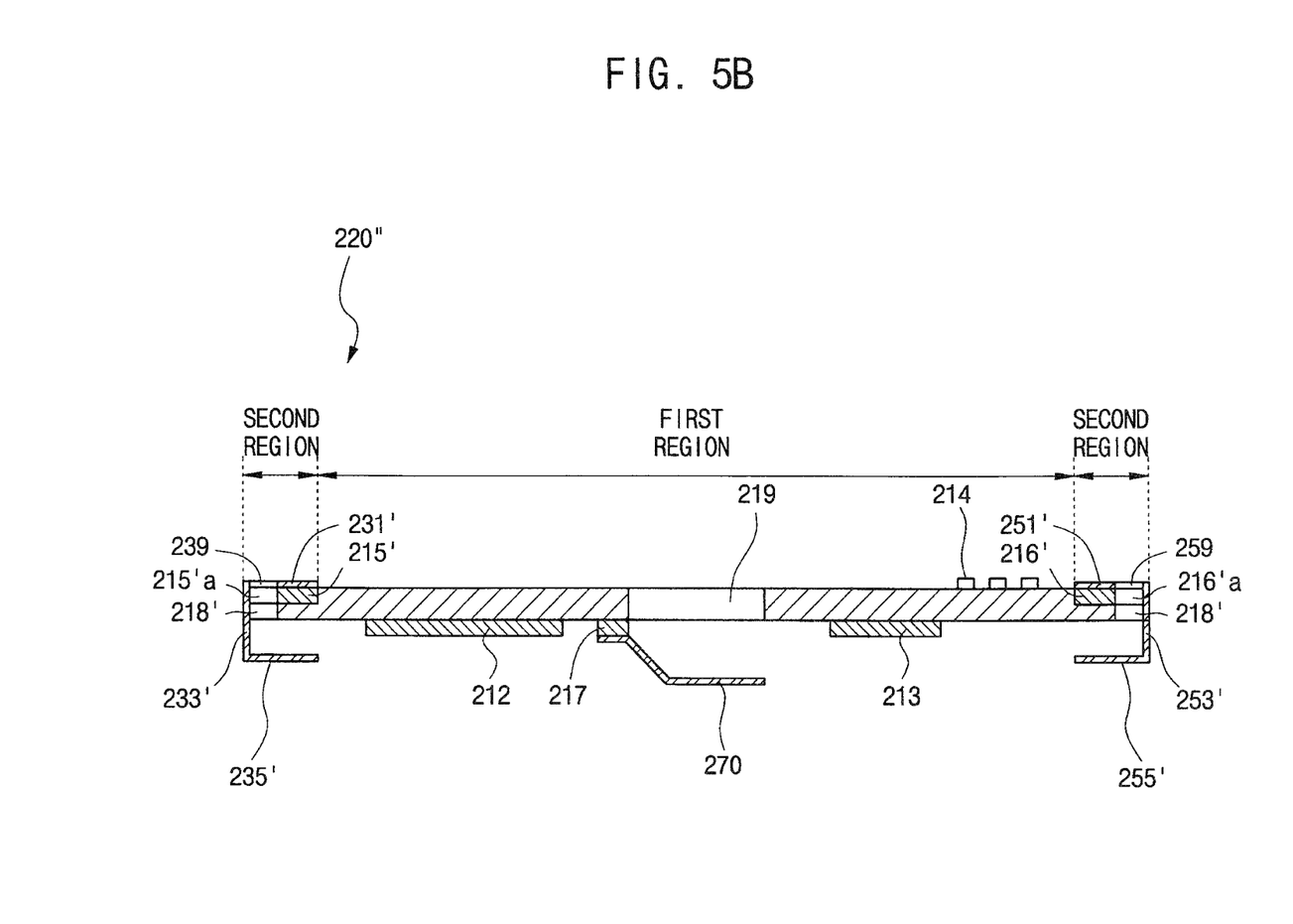
FIG. 5B is an assembled cross-sectional view of a protection circuit assembly of the battery pack of FIG. 5A.

Referring to FIGS. 5A and 5B, a battery pack includes a bare cell 10, and a protection circuit assembly 200" disposed at one side of the bare cell 100.

The bare cell 100 has the same configuration as illustrated in FIG. 1, and thus detailed description thereof will herein be omitted.

The protection circuit assembly 200" includes a protection circuit board 210' and several lead plates 230', 250', 270 for electrical contact between the bare cell 100 and the protection circuit board 210'.

The lead plates 230', 250', 270 have the same configurations and functions as those described above, and thus detailed descriptions thereof will herein be omitted.

The protection circuit board 210' may be formed by mounting a protection module 212, a PTC thermistor 213, an external connection terminal 214, and connection terminals 215', 216', 217 in contact with the lead plates 230', 250', 270, respectively, on a printed circuit substrate 211.

The connection terminals 215', 216', 217 include first connection terminals 215', 216' and a second connection terminal 217.

The protection module 212, the PTC thermistor 213 and the second connection terminal 217 may be mounted under the protection circuit board 210' facing the bare cell 100, and the external connection terminal 214 and the first connection terminals 215', 216' may be mounted on the protection circuit board 210' facing an exterior of the battery pack.

The protection circuit board 210' may include a first region on which the protection module 212, the PTC thermistor 213, the external connection terminal 214 and the second connection terminal 217 are mounted, and second regions on which the first connection terminals 215', 216' are mounted.

The first region is formed generally toward the center of the protection circuit board 210', and the second regions are formed at either lateral edge or end of the protection circuit board 210'.

Thus, the first region is disposed between the second regions.

The protection circuit board 210' includes first grooves 218' formed in both ends or lateral edges of the protection circuit board, i.e., in the second regions of the protection circuit board 210'.

Here, the second regions are regions in which the first connection terminals 215', 216' are mounted, and thus the thickness of the second regions may be thinner than a thickness of the first region.

In one embodiment, the thickness of the second regions may be the same as that of the first region, but when the second regions are thinner than the first region, the thickness of the protection circuit board 210' may be reduced.

The first connection terminals 215', 216' may be formed not to cover the first grooves 218' so as to leave the first grooves 218' exposed.

The first connection terminals 215', 216' may be formed of a flat panel or a flat panel having second grooves 215'a, 216'a corresponding to or aligned with the first groove 218'.

Thus, the bottom surfaces 235', 255' are exposed on the protection circuit board 210' through the first grooves 218' and holes 239, 259 or the first grooves 218', the second grooves 215'a, 216'a and the holes 239, 259.

Since the bottom surfaces 235', 255' are exposed on the protection circuit board 210' when the first lead plates 230', 250' are attached to the cap plate 31, the bottom surfaces 235', 255' can be easily welded by laser welding, ultrasonic welding or resistance welding.

When a groove is formed in an edge of the protection circuit board as in the present invention, a component mounting space can be additionally provided to while allowing the lead plates to be welded to the cap plate.

In addition, as the mounting space becomes wider, the number of layers of the protection circuit board having a multi layer structure can be decreased, and thus the thickness of the protection circuit board can also be decreased.

According to embodiments of the present invention, a component mounting space can be additionally provided, and welding can be performed through a groove formed in a protection circuit board, so that a weld strength can be enhanced.

Although embodiments of the present invention have been shown and described, it would be appreciated by those skilled in the art that changes may be made to the embodiments without departing from the principles and spirit of the invention, the scope of which is defined in the claims and their equivalents.

What is claimed is:

1. A protection circuit assembly comprising:
   a protection circuit board on which a protection module, a positive temperature coefficient thermistor, an external connection terminal and a first connection terminal are mounted, the protection circuit board having two lateral edges, each lateral edge defining a first groove, wherein the first groove is unoccupied;
   a first lead plate having a first surface contacting the first connection terminal and a second surface distal from and parallel to the protection circuit board, wherein the second surface is exposed through the first groove.

2. The protection circuit assembly according to claim 1, wherein the protection circuit board includes a first region to which the protection module, the positive temperature thermistor, and the external connection terminal are mounted, and a second region to which the first connection terminal is mounted and in which the first groove is located.

3. The protection circuit assembly according to claim 2, wherein a thickness of the second region is less than a thickness of the first region.

4. The protection circuit assembly according to claim 1, wherein the first surface and the second surface are both flat surfaces extending in the same direction, and wherein a support surface extends from the first surface and connects to the second surface.

5. The protection circuit assembly according to claim 2, wherein the first connection terminal is a flat panel having a second groove corresponding to the first groove.

6. The protection circuit assembly according to claim 4, wherein the first surface and the second surface extend from a center of the protection circuit board toward the lateral edge.

7. The protection circuit assembly according to claim 6, wherein a length of the first surface is less than a length of the second surface.

8. The protection circuit assembly according to claim 4, wherein a length of the first surface is equal to a length of the second surface, and the first surface includes a third groove corresponding to the first groove.

9. The protection circuit assembly according to claim 4, wherein the first surface and the second surface extend toward a center of the protection circuit board from a proximate lateral edge.

10. The protection circuit assembly according to claim 9, wherein the first surface has a top surface including a top surface hole corresponding to the first groove.

11. The protection circuit assembly according to claim 10, wherein the second surface includes a support surface hole intersecting the top surface hole.

12. A battery pack, comprising:
a bare cell comprising an electrode assembly, a can housing the electrode assembly, and a cap assembly sealing the can, wherein the cap assembly comprises a cap plate;
a protection circuit assembly electrically connected to the bare cell, the protection circuit assembly including a protection circuit board on which a protection module, a positive temperature coefficient thermistor, an external connection terminal and a first connection terminal are mounted, the protection circuit board having two lateral edges, each lateral edge having a first groove, wherein the first groove is unoccupied; and
a first lead plate having a first surface contacting the first connection terminal and a second surface distal from and parallel to the protection circuit board, wherein the second surface is exposed through the first groove and is in contact with the cap plate.

13. The battery pack according to claim 12, wherein the protection circuit board includes a first region to which the protection module, the positive temperature thermistor, and the external connection terminal are mounted, and a second region to which the first connection terminal is mounted and in which the first groove is located.

14. The battery pack according to claim 13, wherein a thickness of the second region is less than a thickness of the first region.

15. The battery pack according to claim 12,
wherein the first surface and the second surface are both flat surfaces extending in the same direction, and
wherein a support surface extends from the first surface and connects to the second surface.

16. The battery pack according to claim 13, wherein the first connection terminal is a flat panel having a second groove corresponding to the first groove.

17. The battery pack according to claim 13, wherein the first surface and the second surface extend from a center of the protection circuit board toward the lateral edge.

18. The battery pack according to claim 17, wherein a length of the first surface is less than a length of the second surface.

19. The battery pack according to claim 15, wherein a length of the first surface is equal to a length of the second surface, and the first surface includes a third groove corresponding to the first groove.

20. The battery pack according to claim 15, wherein the first surface and the second surface extend toward a center of the protection circuit board from a proximate lateral edge.

21. The battery pack according to claim 20, wherein the first surface has a top surface including a top surface hole corresponding to the first groove.

22. The battery pack according to claim 21, wherein the second surface includes a support surface hole intersecting the top surface hole.

* * * * *